United States Patent [19]
Fisher et al.

[11] Patent Number: 4,892,838

[45] Date of Patent: Jan. 9, 1990

[54] METHOD OF MANUFACTURING AN INSULATED GATE FIELD EFFECT TRANSISTOR

[75] Inventors: Carole A. Fisher, Horley; David H. Paxman, Redhill, both of England

[73] Assignee: U.S. Philips Corporation, New York, N.Y.

[21] Appl. No.: 197,542

[22] Filed: May 23, 1988

[30] Foreign Application Priority Data

Jun. 8, 1987 [GB] United Kingdom ............... 8713383

[51] Int. Cl.$^4$ ................. H01L 21/425; H01L 29/78
[52] U.S. Cl. ........................................ 437/41; 437/27; 437/40; 437/50; 437/228; 437/235; 148/DIG. 163
[58] Field of Search ............... 437/233, 235, 27, 28, 437/29, 34, 40, 41, 59, 228, 233, 235; 148/DIG. 163, DIG. 143; 156/643; 357/23.4, 23.8

[56] References Cited

U.S. PATENT DOCUMENTS

| | | | |
|---|---|---|---|
| 3,676,230 | 7/1972 | Rice | 148/DIG. 143 |
| 4,084,987 | 4/1978 | Godber | 437/228 |
| 4,196,507 | 4/1980 | Baptiste | 437/36 |
| 4,198,250 | 4/1980 | Jecmen | 437/36 |
| 4,235,011 | 11/1980 | Butler | 437/27 |
| 4,429,237 | 1/1984 | Cranford, Jr. et al. | 357/23.4 |
| 4,596,068 | 6/1986 | Peters, Jr. | 437/41 |
| 4,667,395 | 5/1987 | Ahlgren et al. | 437/228 |
| 4,682,205 | 7/1987 | Ludilchuize | 357/23.4 |
| 4,712,124 | 12/1987 | Stupp | 357/23.4 |
| 4,760,432 | 7/1988 | Stoisiek et al. | 357/23.4 |
| 4,774,198 | 9/1988 | Contiero et al. | 437/29 |

OTHER PUBLICATIONS

Glogolja et al., "Smart-Sipmos—An Intelligent Power Switch", IEEE Industry Applications Society Annual Meeting, 1986, pp. 429–433.

*Primary Examiner*—Brian E. Hearn
*Assistant Examiner*—T. Thomas
*Attorney, Agent, or Firm*—Paul R. Miller

[57] ABSTRACT

A method of manufacturing a semiconductor device in which a lateral insulated gate field effect transistor (IGFET) (1) is provided by defining an insulated gate structure (12) on a given surface (3a) of a semiconductor body (3) by providing an insulating layer on the given surface (3a) having a relatively thin region on a first area of the given surface adjoining a relatively thin region (14a) on a second area (31b) of the given surface and providing a conductive layer (15,16) on the insulating layer to define an insulated gate over the first area of the given surface with the conductive layer extending up onto the relatively thick region of the insulating layer. A window (26) is opened in the conductive layer on the relatively thick region of the insulating layer and the insulating layer is then etched isotropically through the window in the conductive layer to form a window (25) in the relatively thick region of the insulating layer thereby leaving part (29) of the conductive layer overhanging the edge of the window in the insulating layer. The conductive layer is then selectively etched with at least the area of the conductive layer spaced from the window masked so as to remove the part (29) overhanging the edge of the window (25) in the insulating layer. Impurities are then introduced using the insulated gate structure (12) as a part of a mask to form a source region (9) aligned with the insulated gate and a drain region (10) aligned with the window in the conductive layer (15, 16).

8 Claims, 4 Drawing Sheets

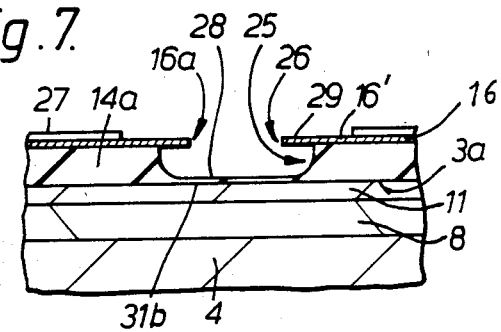
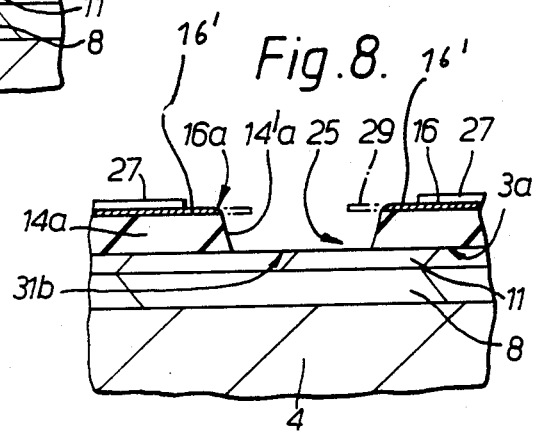
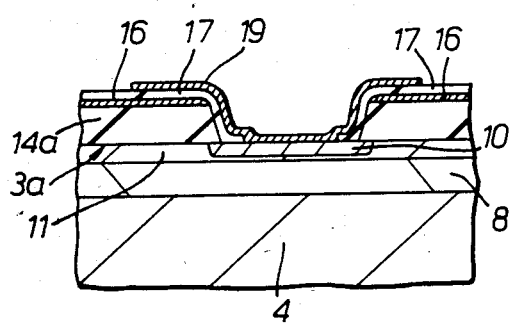
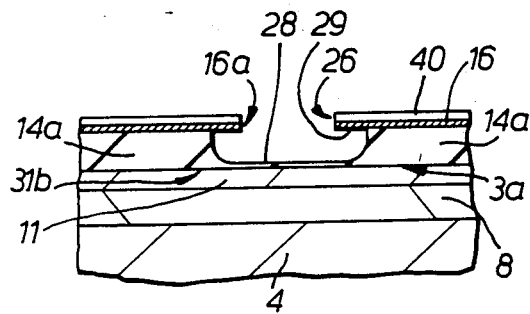
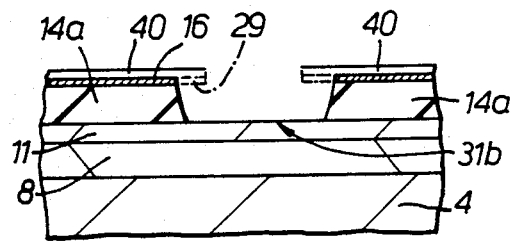

METHOD OF MANUFACTURING AN INSULATED GATE FIELD EFFECT TRANSISTOR

This invention relates to a method of manufacturing a semiconductor device comprising a lateral insulated gate field effect transistor (IGFET), especially such an IGFET which may be suitable for use in an intelligent power switch.

A paper entitled 'Smart-SIPMOS— an intelligent power switch' by M. Glogolja and Dr. J. Tihanyi, published in the Conference Record of the 1986 IEEE Industry Applications Society Annual Meeting Part 1 at pages 429 to 433 describes an intelligent power switch, that is a semiconductor device in which one or more power semiconductor components are provided in or on the same semiconductor body as logic components for controlling and monitoring operation of the power semiconductor component and a load in circuit with the switch.

This paper shows, in FIG. 4, a lateral IGFET having source and drain regions adjacent a given surface of a semiconductor body and an insulated gate structure which is defined on the given surface between the source and drain region by providing an insulating layer on the given surface having a relatively thin region on a first area of the given surface adjoining a relatively thick region on a second area of the given surface and providing a conductive layer on the insulating layer to define an insulated gate over the first area of the given surface with the conductive layer extending up onto the relatively thick region of the insulating layer towards the drain region so as to provide field relief.

It is an aim of the present invention to provide a method of manufacturing such a lateral insulated gate field effect transistor.

According to the present invention, there is provided a method of manufacturing a semiconductor device comprising a lateral insulated gate field effect transistor, which method comprises defining an insulated gate structure on a given surface of a semiconductor body having a first region of one conductivity type adjacent the given surface by providing an insulating layer on the given surface having a relatively thin region on a first area of the given surface adjoining a relatively thick region on a second area of the given surface and providing a conductive layer on the insulating layer to define an insulated gate over the first area of the given surface with the conductive layer extending up onto the relatively thick region of the insulating layer, opening a window in the conductive layer on the relatively thick region of the insulating layer overlying the second area, etching the insulating layer isotropically through the window in the conductive layer to form a window in the relatively thick region of the insulating layer thereby leaving part of the conductive layer overhanging the edge of the window in the insulating layer, selectively etching the conductive layer with at least the area of the conductive layer spaced from the window masked so as to remove the part overhanging the edge of the window in the insulating layer, and introducing impurities into the semiconductor body using the insulated gate structure as a mask to form a source region of the one conductivity type aligned with the insulated gate and a drain region of the one conductivity type spaced from the source region and aligned with the window in the relatively thick region of the insulating layer.

The use of a method embodying the invention enables the use of reactive ion etching, which although capable of providing a good edge to the window in the insulating layer is both expensive and time-consuming, to be avoided and allows an isotropic wet etching technique to be used to etch the relatively thick region of the insulating layer by enabling the part of the conductive layer left overhanging the window in the insulating layer to be removed so avoiding problems such as bad coverage of a subsequent insulating layer causing voids in the insulating layer and breaks in subsequent metallisation deposited onto the surface because of the sharp bend or corner such an overhang provides.

A method embodying the invention not only enables the possibilities of voids in a subsequent insulating layer and breaks in subsequent metallisation to be reduced, but also allows a drain region self-aligned to the final edge of the conductive layer to be provided, the extension of the conductive layer onto the relatively thick region of the insulating layer providing a field plate for reducing surface electrostatic fields.

A method embodying the invention may comprise wet etching the relatively thick insulating region to define the window in the relatively thick insulating region and then plasma etching the conductive material to remove the conductive material overhanging the edge of the window in the relatively thick insulating material region.

The conductive layer may be masked after opening the window in the conductive layer so that the upper and lower surfaces of the part of the conductive layer overhanging the edge of the window in the insulating layer are exposed for selective etching. In such a case the mask protecting the remainder of the conductive layer may have a window which is larger than the window in the conductive layer so that an area of the conductive layer adjacent the edge of the window is exposed during the selective etching because although the etchant will also etch the exposed area adjacent the edge of the window, the overhanging part will be etched more quickly as it will be etched from both sides and so only a thinning of the area of the conduction layer adjacent the window will occur in the time taken for the overhanging part to be removed. The provision of the mask protecting the conductive layer is not a critical alignment step because as indicated above only a thinning of the exposed area of the conductive layer adjacent the edge of the window should occur resulting in a tapering of the conductive layer towards the window. What is of importance is that the subsequent drain region is a aligned to the edge of the window in the conductive layer to minimize overlap capacitance effects.

Alternatively, a mask, for example a photosensitive resist mask, provided on the conductive layer to define the window in the conductive layer may be left in place during the isotropic etching of the insulating layer and subsequent selective etching of the conductive layer. In such an arrangement, during the selective etching the upper surface of all of the conductive layer remains protected by the mask while the under surface of the part of the conductive layer overhanging the window in the insulating layer is exposed enabling the overhang to be etched away. Thus, thinning of the edge of the conductive layer during removal of the overhang may be avoided or reduced.

Prior to etching the insulating layer, impurities may be introduced into the semiconductor body to form a second region of the opposite conductivity type having a first subsidiary region underlying part of the insulated gate so that the source region is formed within the first subsidiary region and defines therewith a conduction channel area beneath the insulated gate.

Impurities of the one conductivity type may be introduced into the semiconductor body prior to defining the insulated gate structure to provide a drain extension region adjacent the given surface extending towards the source region. Impurities of the opposite conductivity type may be introduced into the semiconductor body prior to defining the insulated gate structure to provide a second subsidiary region of the second region to adjoin the first subsidiary region and surround the drain region. The drain extension region may be a RESURF (REduced SURface field) region which acts to increase the reverse breakdown voltage of the pn junction between the drain and second region by causing the depletion region of the pn junction to spread laterally and so reduce the surface electrostatic field. In order to form such a RESURF region where the semiconductor body comprises a monocrystalline sylicon body, the product Nd of the doping concentration N in atoms cm$^{-3}$ and depth or thickness d of the region should be approximately $2 \times 10^{12}$ atoms cm$^{-2}$. Where the semiconductor body comprises a monocrystalline silicon body, the conductive layer may comprise a doped polycrystalline silicon layer.

Where the second subsidiary region is present the second region isolates the IGFET from the first region. The second subsidiary region may similarly be a RESURF region to provide high voltage isolation from the first region.

A vertical IGFET may be manufactured in the semiconductor body at the same time as the lateral IGFET by providing a further insulated gate structure on a third area of the given surface and introducing impurities to form a further second region and a further source region aligned with the further insulated gate, the first region of the semiconductor body being adjacent a surface of the semiconductor body opposite the given surface and providing the drain region of the vertical IGFET.

It will be understood from the above, that a vertical IGFET is a device in which the source and drain regions are adjacent opposite surfaces of the semiconductor body so that current flow is in a vertical direction and a lateral IGFET is a device in which the source and drain region are adjacent the same surface so that the current flows laterally in the semiconductor body.

Embodiments of the invention will now be described, by way of example, with reference to the accompanying drawings, in which:

FIGS. 7 to 9 are schematic cross-sectional views of part of a semiconductor body illustrating a first method for providing a drain region of the IGFET shown in FIG. 6;

Figure 6:
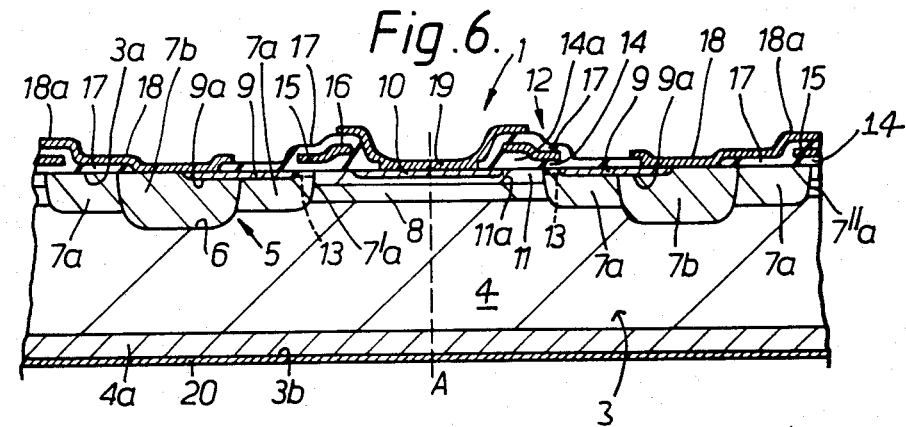
Figure 12:
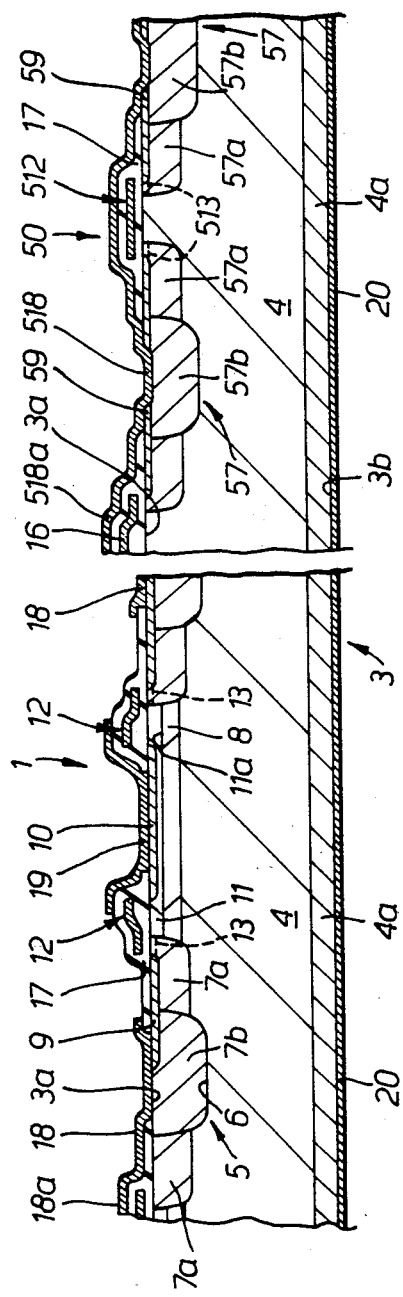

FIGS. 10 and 11 are schematic cross-sectional views of part of a semiconductor body illustrating a second method for providing a drain region of the IGFET shown in FIG. 6; and FIG. 12 is a schematic cross-sectional view, part cut-away, of a semiconductor device comprising a lateral insulated gate transistor and a vertical insulated gate transistor and manufactured using a method in accordance with the invention.

Referring now to the drawings, it should be understood that the FIGURES are merely schematic and are not drawn to scale. In particular certain dimensions such as the thickness of layers or regions may have been exaggerated while other dimensions may have been reduced. It should also be understood that the same reference numerals are used throughout the FIGURES to indicate the same or similar parts.

Referring firstly to FIG. 6, there is shown a lateral insulated gate field effect transistor. Only part of the IGFET is shown and it should be appreciated that the IGFET is symmetrical about an axis indicated by the dashed line A in FIG. 6.

The semiconductor device shown in FIG. 6 comprises a semiconductor body 3 of one conductivity type (n-type in this example where the minus sign indicates relatively low doping). The semiconductor body 3 comprises an epitaxial layer 4 on a relatively highly doped substrate 4a.

The IGFET 1 comprises a second region 5 of the opposite conductivity type (p type in this example) which meets a given surface 3a of the semiconductor body and which, given that the structure is symmetrical about the axis A, provides a well which forms a pn junction 6 with the substrate 4a so as to isolate the IGFET 1 from the epitaxial layer or first region 4 for reasons which will be explained hereinafter.

The second region 5 comprises an outer or first subsidiary region 7a which is annular when viewed in plan and defines the periphery of the well and a second or central subsidiary region 8. It should be understood that, as used herein, the term 'annular' includes, for example, annuli of circular, elliptical, rectangular or other polygonal shapes, the shape of the outer subsidiary region 7a when viewed in plan looking down onto the given surface 3a being determined by the desired geometry of the device.

The outer subsidiary region 7a is a relatively shallow region 7a and a more highly doped relatively deep region 7b is disposed centrally of the relatively shallow outer subsidiary region 7a to form with the outer subsidiary region 7a a body region 7.

The central or second subsidiary region 8 which extends between and adjoins the inner periphery 7'a of the first subsidiary region 7a is sufficiently lowly doped and sufficiently thin so that the second subsidiary region 8 becomes fully depleted of free charge carriers in operation of the IGFET 1 before a reverse-biassing voltage across the pn junction 6 reaches the breakdown voltage of the pn junction 6. The second subsidiary region 8 thus acts to spread the depletion region of the reverse-biassed pn junction 6 laterally (i.e. along the surface 3a) and so reduces the electrostatic field at the given surface 3a, thereby increasing the breakdown voltage of the pn junction 6. Such a region is known as a RESURF (REduced SURface Field) region and is described in detail in, for example, a paper entitled 'high voltage thin layer devices (RESURF devices)' by J. A. Appels et al published in Philips Journal of Research Vol 35 No 1 1980 at pages 1 to 13. As indicated in the aforementioned paper in order to function as a RESURF region, the product Nd of the thickness (or depth) in cm and the doping concentration N in atoms cm$^{-3}$ of the region should be approximately $2 \times 10^{12}$ atoms cm$^{-2}$.

A source region 9 of the one conductivity type (n+ type in this example where the plus sign indicates relatively high doping) is provided within and forms a pn junction 9a with the body region 7 adjacent the given surface 3a. As shown in FIG. 7, the source region 9 is offset toward the inner periphery 7a' of the relatively shallow region 7a and extends into the relatively deep region 7b. A drain region 10 of the one conductivity type (n+ type in this example) is similarly provided adjacent the given surface in the RESURF or central subsidiary region 8 so as to be spaced apart from the source region 9. As indicated above, the IGFET 1 is symmetrical about the axis A and therefore the source region 9 is annular and surrounds the drain region 10.

A lowly doped region 11 of the one conductivity type adjacent the given surface 3a provides an extension of the drain region 10 towards the source region 9. The lowly doped drain extension region 11 forms a further RESURF region which enables the IGFET 1 to withstand not only a high voltage between the drain region 10 and the first region or substrate 4 but also to withstand a high voltage between the source and drain regions 9 and 10. As shown in FIG. 6, the drain region 10 lies wholly within the RESURF drain extension region 11 and the RESURF drain extension region 11 forms a pn junction 11a with the RESURF region 8.

An insulated gate 12 overlies a first area 31a (FIG. 2) of the given surface 3a so that the underlying relatively shallow region 7a provides a channel area 13 which, under control of a signal applied to the insulated gate 12, provides a gateable connection between the source and drain regions 9 and 10. The insulated gate 12 comprises a relatively thin insulating layer 14 of, for example, silicon dioxide and an overlying electrically conductive gate layer 15 of, for example doped polycrystalline silicon. The conductive gate layer 15 may however be a metal layer or a metal silicide layer or a composite of two or more of the afore-mentioned layers.

The conductive gate layer 15 is stepped up over a relatively thick insulating layer 14a to provide a field plate 16 which overlies a second area 31b of the given surface 3a and which, together with the RESURF drain extension region 11, acts to help the IGFET withstand high voltages between the source region 9 and drain region 10 and between the drain region 10 and the first region 4.

As illustrated in FIG. 6, the outer periphery 7"a of the second region 5 may be similarly covered with a relatively thin insulating layer 14 upon which is provided the conductive gate layer 15. Again, although not shown, the conductive gate layer 15 may be stepped up over a relatively thick insulating layer to provide a field plate for the periphery of the IGFET 1.

A further insulating layer 17 of silicon dioxide extends over the conductive gate layer 15. Metallisation, for example aluminum, is provided on the given surface 3a to provide, via windows opened in the further insulating layer 17, electrical contacts 18 and 19 for the source and drain regions 9 and 10 respectively and to provide, via a window (not shown) opened in the insulating layer 17, an electrical contact (not shown) to the conductive gate layer 15.

For reasons which will be described hereinafter, metallisation 20 may also be provided on the surface 3b of the substrate 4a opposite the given surface 3a.

The doping of the channel area 13 may be controlled to provide either an enhancement mode (normally off) or a depletion mode IGFET. In the arrangement being described, however, the relatively shallow outer subsidiary region 7a overdopes the RESURF drain extension region 11 to provide an enhancement mode IGFET.

A first embodiment of a method in accordance with the invention for manufacturing the lateral IGFET 1 will now be described with reference to FIGS. 1 to 9.

Figure 1:
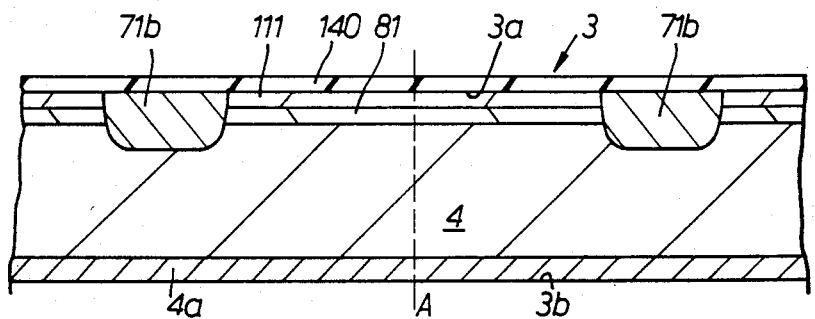
FIGS. 1 to 6 are schematic cross-sectional views, part cut-away, of a semiconductor body illustrating various steps in a first embodiment of a method in accordance with the invention for providing a high voltage lateral IGFET.

Referring firstly to FIG. 1, an n-type monocrystalline silicon epitaxial layer 4 having a resistivity of, typically, 1 to 5 ohm cm is provided on a highly doped n-type substrate 4a.

After cleaning to remove surface contaminants and to grow a protective layer of thermal silicon dioxide, p-type impurities are locally implanted into the semiconductor body 3 via the given surface 3a using an appropriate mask and are caused to diffuse partially into the semiconductor body 3 to provide a p-type region 71b which, after subsequent processing, will form the relatively deep region 7b of the IGFET 1. In this example, the p-type impurity used is boron with an implantation energy of 45 KeV (Kilo election volts) and a dose of $5 \times 10^{14}$ atoms cm$^{-2}$ and the impurities are partially driven into the semiconductor body by heating the semiconductor body to a temperature of approximately 900 degrees Celsius in an inert atmosphere.

P-type impurities are then implanted into the semiconductor body via the given surface 3 using an appropriate mask and subsequently n-type impurities are implanted through an appropriate subsequent mask to form regions 81 and 111 respectively which, after subsequent processing, will provide the RESURF central subsidiary region 8 and the RESURF drain extension region 11. In this example the p-type impurity used is boron with an implantation energy of 170 KeV and a dose of from $2 \times 10^{12}$ to $10 \times 10^{12}$ atoms cm$^{-2}$ while the n-type impurity is arsenic with an implantation energy of 170 KeV and a dose of from $1 \times 10^{12}$ to $5 \times 10^{12}$ atoms cm$^{-2}$.

The introduced impurities are then caused to diffuse into the semiconductor body by heating the semiconductor body. The heating is carried out in an oxidising atmosphere so that, simultaneously with the diffusion, a relatively thick layer 140 of silicon dioxide is grown on the given surface 3a. In this particular example, the semiconductor body is heated to 1100 degrees Celsius in an oxidising atmosphere for 255 minutes to produce a relatively thick layer or field oxide layer of approximately 0.8 micrometers (8000 Angstroms) thickness. The heat treatment in the oxidising atmosphere may comprise a first heating step in a dry oxygen atmosphere and a subsequent wet oxidising step in a wet oxygen atmosphere.

The relative duration of the dry and wet oxidising steps do not significantly affect the drive in of the impurities to form the relatively deep region 7b and, by adjusting the dose of impurities introduced to produce the RESURF central subsidiary region 8 and the RESURF drain extension region 11 and the relative durations of the wet and dry oxidation steps, the desired thickness of the relatively thick or field oxide layer 140 can be grown without detrimentally affecting the desired profile for the RESURF central subsidiary region 8 and the RESURF drain extension region 11. For example, for a boron dose of $8 \times 10^{12}$ atoms cm$^{-2}$ and an arsenic dose of $3 \times 10^{12}$ atoms cm$^{-2}$, the dry oxidising step may last say 140 minutes and the wet oxidising step 105 minutes.

Figure 2:
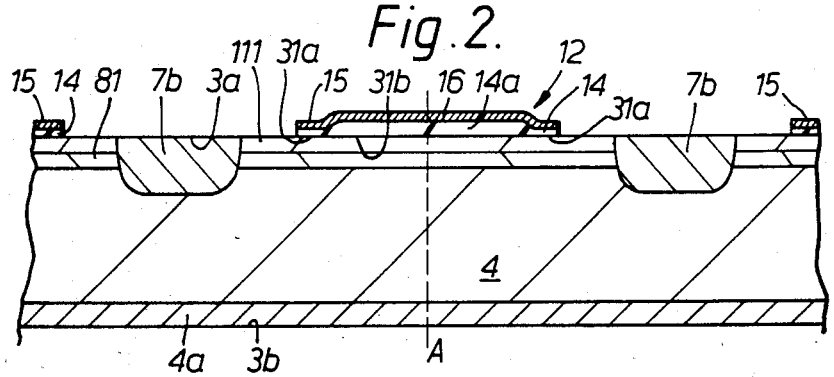

Referring now to FIG. 2, the field oxide or relatively thick insulating layer is then patterned or defined using a conventional photolithographic and etching technique to define the relatively thick insulating layer 14a. A relatively thin insulating layer of gate oxide is then grown on the given surface 3a. Polycrystalline silicon is then deposited on the insulating layer 14, 14a and doped in a conventional manner to provide the conductive layer 15, 16 and the layers are then patterned or defined using conventional photolithographic and etching technique to provide the insulated gate structure 12 shown in FIG. 2.

Using the insulated gate structure 12 as a mask, p-type impurities, in this example boron, are implanted into the semiconductor body 3 to provide the relatively shallow outer subsidiary region 7a of the IGFET 1.

Figure 3:
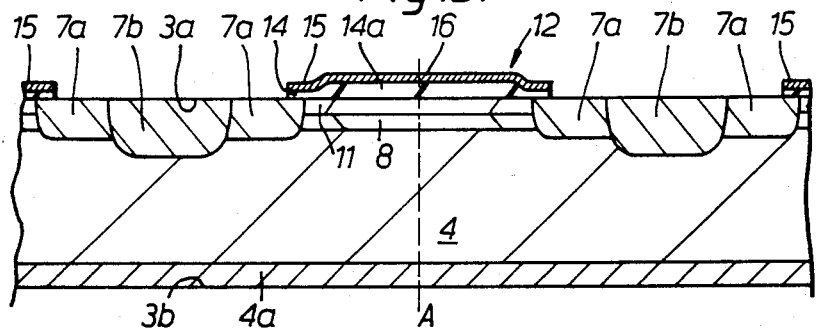
Figure 4:
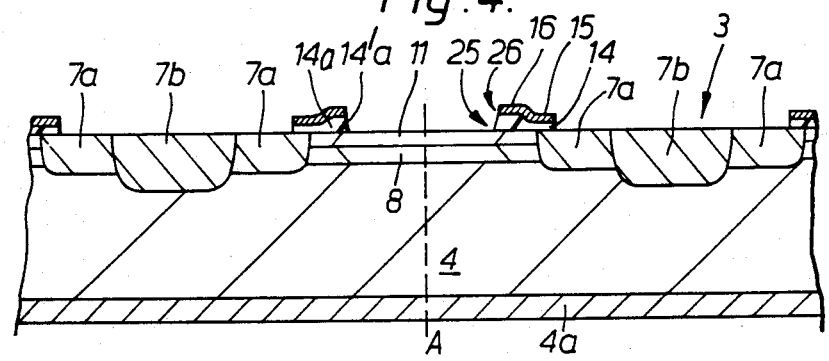
Figure 5:
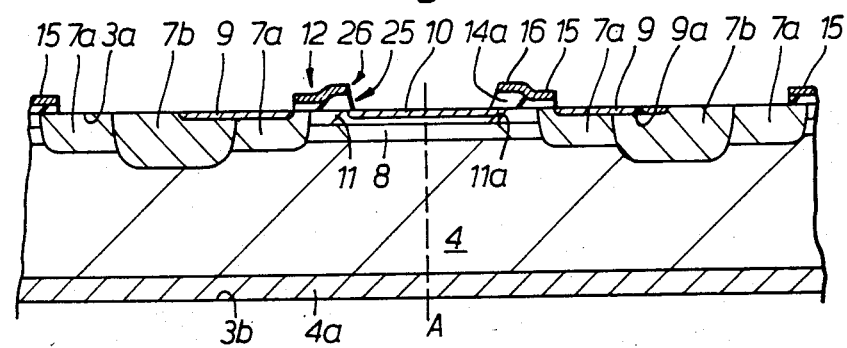

As can be seen from a comparison of FIGS. 3 and 6, the second area 31b of the given surface 3a where the drain region 10 is to be provided is, at the stage shown in FIG. 3, covered by the relatively thick insulating layer 14a and the overlying conductive layer 16. Accordingly, in order to enable formation of the drain region 10 it is first necessary to open a window in the conductive layer 16 and relatively thick insulating layer 14a.

FIGS. 7 to 9 illustrate a first embodiment of a method in accordance with the invention for enabling formation of the drain region 10.

Referring firstly to FIG. 7, the window 26 is first opened in the polycrystalline silicon layer 15, 16 using a photoresist mask and a selective etching process such as a plasma etching process. The plasma etching process may be, for example, carried out in a barrel type reactor at 400 Torr ($5.3 \times 10^4$ Pa) using a carbon tetrafluoride (CF$_4$) plasma containing about 8% oxygen. Although in the method being described the window 26 is opened after the impurities for forming the outer subsidiary region 7a have been introduced, this need not necessarily be the case because the underlying relatively thick insulating layer 14a will protect or mask the second area 31b against the implant for forming the outer subsidiary region 7a even if the window 26 has already been opened in the conductive layer 16. Indeed, to reduce then number of processing steps, the window 26 will normally be opened during the patterning of the conductive layer to form the insulated gate 12. Assuming the impurities to form the outer subsidiary region 7a have been introduced where this is carried out after opening of the window 26, a mask 27 is then provided on the polycrystalline silicon layer 15,16. As the mask 27 is required mainly to protect the insulated gate structure 12, alignment of the mask 27 to the window 26 is not required and as indicated the opening in the mask 27 may be considerably larger than the window 26. The insulating material 14a is when wet etched, using for example buffered HF, through the window 26 to a desired depth which leaves a thin layer 28, for example 1000 Angstroms, of insulating material covering the surface 3a within the window 26 to protect the surface 3a.

As indicated in FIG. 7, the wet etching causes under or back etching of the relatively thick insulating layer 14a so leaving an overhang 29 of polycrystalline silicon which if left in place would, as indicated above, result in both the subsequent insulating layer 17 and metallisation 19 having to be provided on a very stepped surface which sharply doubles back on itself under the overhang.

After the insulating material 14a has been wet-etched as described above, with the mask 27 still in place to protect the area of the conductive layer 15,16 surrounding the window, the exposed polycrystalline silicon is selectively etched using a process such as a plasma etching process. To give an example, the plasma etching process may be carried out in a barrel reactor at 400 Torr ($5.3 \times 10^4$ Pa) using a carbon tetrafluoride (CF$_4$) plasma containing about 8% oxygen. As both the upper and lower surfaces of the overhang 29 are exposed, whereas only the top surface of the area 16' of polycrystalline silicon adjacent the edge 16a of the window 26 not protected by the mask 27 is exposed, the overhang 29 will be etched away from both sides and so will be removed in a time shorter than is necessary to remove the area 16' of polycrystalline silicon adjacent the edge 16a of the window 26. Thus, the selective etching of the exposed polycrystalline silicon enables the overhang 29 to be removed while only a slight reduction in the thickness of the area 16' occurs so that the layer tapers towards the edge 16a.

A final short wet etching step may then be performed to remove the thin insulating layer 28 which protected the surface 3a within the window 25 during the plasma etching and also to smooth out the edge 14'a of the window 25. Although the final dimension of the window 26 may not be precisely controlled using such a process, this is not a problem because what is of importance is that the subsequent drain region 10 is aligned to the edge 16a (FIG. 8) of the window in the polycrystalline silicon layer 15,16 to facilitate preservation of the integrity of the RESURF drain extension region 11 and this is achieved automatically by using the window 26 as a mask for the introduction of the impurities to form the drain region 10 as will become evident below.

The above described method thus enables a window to be opened in the relatively thick insulating layer 14a using a process which is relatively cheap and quick without the problem which would have arisen if a conventional simple wet etching technique had been used. Typically, such a method may comprise, where the relatively thick insulating layer is approximately 8000 Angstroms thick, an approximately 16 minute wet etch to open the window 25, a subsequent plasma etch for approximately three minutes to remove the overhang 29 and a final short, approximately twenty second, wet etch to remove the insulating layer 28.

A modification of the method of opening the window to enable formation of the drain region 10 described with reference to FIGS. 7 to 9 is shown in FIGS. 10 and 11. Thus, as shown in FIG. 10, the window 26 is opened after introduction of the impurities to form the first subsidiary region 7a. A photosensitive resist mask 40 is then used with a plasma etching technique, for example the one mentioned above to define the window 26 in the polycrystalline silicon layer. The insulating material layer 14a is then wet etched with the photosensitive resist mask 40 still in place and the plasma etching process mentioned above used again to remove the polycrystalline silicon overhang 29. Such a method may have advantages in that, because the entire upper surface of the polycrystalline silicon layer remains protected by the photosensitive resist mask, so that the overhang 29 is etched away from the underneath upwards and thinning of the polycrystalline silicon layer 15, 16 around the window 26 during removal of the overhang 29 is avoided or at least reduced as the surface of the polycrystalline layer 15, 16 is protected by the photosensitive resist mask. In a typical process, the plasma etch through the photoresist mask may have a duration of approximately 8.5 minutes, the subsequent wet etching step a duration of approximately 16 minutes and the final plasma etch a duration of approximately three minutes.

Having opened the window 25, n-type impurities, in this example arsenic with an implantation energy of 80 KeV and a dose of $4 \times 10^{15}$ atoms cm$^{-2}$, are implanted into the given surface using the insulated gate structure 12 as a mask to produce the source and drain regions 9 and 10 of the IGFET 1 (FIG. 6).

The further insulating layer 17, in this example of silicon dioxide, is then deposited onto the given surface 3a. Windows are then opened in the insulating layer 17 and metallisation, for example aluminum, deposited (FIG. 6) to form the source and drain contacts 18 and 19 and the gate contact (not shown). The source contact metallisation extends outwardly over the insulating layer 17 beyond the outer periphery 7"a of the body region 7 to provide a field plate 18a. The gate polycrystalline silicon layer 15, 16 may similarly extend outwardly beyond the outer periphery 7"a up onto relatively thick insulating material (not shown) to provide a double field plate structure. Metallisation 20 on the opposite surface 3b may be provided merely for subsequent encapsulation or packaging purposes or for other reasons as well be described below.

The lateral insulated gate field effect transistor described above may be the only semiconductor component being formed in or on the semiconductor body. It will, however, be appreciated that more than one lateral insulated gate field effect transistors may be formed in the semiconductor body at the same time.

One or more further semiconductor components may be manufactured in or on the semiconductor body with the lateral insulated gate field effect transistor(s). Thus, for example, one or more high power semiconductor components may be provided in the same semiconductor body as may one or more low voltage logic type semiconductor components enabling the production of a so-called intelligent power switch, that is a semiconductor device in which logic circuitry for controlling operation of a high power semiconductor device is incorporated in or on the same semiconductor body for use in controlling power supply to lights, electric motors etc. under the control of logic signals from a central control circuit. For example a simple bus system, central control unit and such intelligent power switches may be used to replace the traditional loom used for distributing power in motor vehicles.

FIG. 12 illustrates part of an intelligent power switch semiconductor device in which a vertical insulated gate field effect transistor in the form of a power MOSFET 50 is integrated with one or more IGFETs 1 of the type described above. In the interests of simplicity only part of one lateral IGFET 1, is shown in FIG. 12.

A vertical IGFET is so called because the source and drain contacts are on opposite surfaces of the semiconductor body so that current flow is in a vertical direction through the semiconductor body. A vertical power MOSFET is normally made up of many hundreds of parallel-connected IGFET cells have a common drain region and it should be appreciated that in the interests of simplicity FIG. 12 shows only a small part of the vertical power MOSFET.

As shown in FIG. 12, a cell of the vertical power MOSFET 50 consists of a body region 57 of the one conductivity type formed within the n-type substrate 4 of the semiconductivity body 3. The body region 57 has a relatively deep relatively highly doped region 57b and a surrounding relatively shallow region 57a. A source region 59 of the one conductivity type (n type in this example) is provided within the body region 57 adjacent the given surface and an insulated gate structure 512 overlies channel areas 513 of the body region 57 to provide a gateable connection to the drain region, the drain contact being provided by the metallisation 20 mentioned above.

As should be appreciated from the above, the vertical power MOSFET may be manufactured using the methods described above at the same time as the lateral insulated gate IGFET by appropriate mask modification. Thus, the impurities to introduce the relatively deep region 57b may be introduced at the same time as the impurities to form the relatively deep region 7b, the area 31c of the given surface 3a in which the power MOSFET is being manufactured then being masked during introduction of the impurities to form the regions 8 and 11. The insulated gate structure 512 may similarly be formed at the same time as the insulated gate structure 12 and the impurities to form the relatively shallow region 57a and source region 59 may similarly be introduced via the insulated gate structure 512 at the same time as the impurities to form the relatively shallow region 57a and the source region 9, the gate structure 512 of the power MOSFET being protectively masked during the opening of the window 25.

The source metallisation 518 and gate metallisation for the power MOSFET 50 may be provided at the same time as the source and drain 18 and 19 and gate metallisation of the IGFET 1 by depositing metal, after opening the necessary windows in the insulating layer 17, and then appropriately patterning the deposited metal.

As will be appreciated by those skilled in the art, each source region 59 of the power MOSFET 50 should be shorted to the associated body region 57 so as to inhibit parasitic bipolar action. This may be done by, for example, masking the source implant so that a central portion of the body region 57 extends to the given surface 3a or, as shown in FIG. 12, by etching away a central portion of the source region 59 using an appropriate photolithographic and etching process to expose the central portion of the body region 57 before depositing the metal to form the source metallisation 518.

Although the edges of the conductive gate layers 15, 16 have been illustrated as being straight or vertical, the edges especially of any power MOSFET gate layer may be bevelled or tapered using a technique such as that described in Siemens Forschungs und Entwicklungs Berichte Bd 9(1980) Nr 4 at page 192.

The geometry of the various regions when viewed in plan may be circular, square (or rectangular) with rounded corners or hexagonal or any other suitable shape but for convenience all the regions should have the same geometry. Thus, for example, if a power MOSFET having a rectangular matrix pattern of square cells (i.e. square outline body and source regions) is desired then the IGFET regions should have a similar outline or geometry with the subsidiary region 7 and the source region 9 having a square frame shape.

The relatively deep region 57b is desirable to reduce the on resistance of the vertical power MOSFET 50 and may be omitted from the lateral IGFET 1 so that the subsidiary region 7 is formed solely by the relatively shallow region 7a.

The IGFET 1 described above is a high voltage lateral IGFET designed for use in an intelligent power switch where the drain contact of the integrated power MOSFET 50 is to be connected to the positive supply terminal of, for example, a motor vehicle battery and the IGFET connected between the supply terminals of the battery so that a voltage equal or nearly equal to the battery voltage exists across the IGFET in operation of the intelligent power switch. In such circumstances, the IGFET needs to be capable of withstanding high voltages and so the RESURF region 8 is included to enable the IGFETs to withstand the high reverse voltages which may occur when the source 9 (or drain 10 if the conductivity types given above are reversed) and semiconductor body 3 via the substrate 4a are at the positive supply voltage and the drain 10 (or source 9 if the conductivity types given above are reversed) is at the negative supply voltage, (normally ground) and the RESURF region 11 is included to enable the IGFETs to withstand the high reverse voltage occurring when the IGFETs is off and the substrate 4a is at the positive battery supply voltage. Normally the voltage difference across the supply terminals of the battery would be 12 v or 24 v but the IGFETs need to be able to cope with voltage spikes and so for such a use are designed to cope with higher reverse voltages, for example up to 50 v.

In addition to the RESURF regions, the high voltage lateral IGFETs should have a field relief edge termination system as should the power MOSFET. Any suitable edge termination system may be used and the system selected will depend on the desired breakdown voltage of the device. For example, one or more field relief annular regions (not shown) formed at the same time as the relatively deep regions 7b and 57b may surround the active device area of the power MOSFET 50. The polycrystalline silicon gate layer may be extended outwardly up onto an extension 14'a of the relatively thick insulating layer to provide a field plate 16 and the source metallisation similarly may be extended outwardly over the insulating layer 17 to provide a field plate 518a. The lateral IGFET may have a similar field plate structure to the power MOSFET 50.

The conductivity types of the regions of the semiconductor device could of course be reversed to provide p-channel devices and the invention may be applicable to semiconductor devices comprising semiconductor materials other than silicon. Furthermore, the power MOSFET may be replaced by any type of MOS-gated power device.

From reading the present disclosure, other modifications will be apparent to persons skilled in the art. Such modifications may involve other features which are already known in the design and manufacture of semiconductor devices and which may be used instead of or in addition to features already described herein. Although claims have been formulated in this application to particular combinations of features, it should be understood that the scope of the disclosure of the present application also includes any novel feature or any novel combination of features disclosed herein either explicitly or implicitly or any generalisation or modification of one or more of those features, whether or not it relates to the same invention as presently claimed in any claim and whether or not it mitigates any or all of the same technical problems as does the present invention. The applicants hereby give notice that new claims may be formulated to such features and/or combinations of such features during the prosecution of the present application or of any further application derived therefrom.

We claim:

1. A method of manufacturing a semiconductor device comprising a lateral insulation gate field effect transistor, which method comprises defining an insulated gate structure on a given surface of a semiconductor body having a first region of one conductivity type adjacent the given surface by providing an insulating layer on the given surface having a relatively thin region on a first area of the given surface adjoining a relatively thick region on a second area of the given surface and providing a conductive layer on the insulating layer to define an insulated gate over the first area of the given surface, with the conductive layer extending up onto the relatively thick region of the insulating layer, opening a window in the conductive layer on the relatively thick region of the insulating layer overlying the second area, etching the insulating layer isotropically through the window in the conductive layer to form a window in the relatively thick region of the insulating layer thereby leaving part of the conductive layer overhanging the edge of the window in the insulating layer, selectively etching the conductive layer with at least the area of the conductive layer spaced from the window masked so as to remove the part overhanging the edge of the window in the insulating layer, and introducing impurities into the semiconductor body using the insulated gate structure as a mask to form a source region of the one conductivity type aligned with the insulated gate and a drain region of the one conductivity type spaced from the source region and aligned with the window in the relatively thick region of the insulating layer.

2. A method according to claim 1, which comprises masking the conductive layer after opening the window in the conductive layer so that the upper and lower surfaces of the part of the conductive layer overhanging the edge of the window in the insulating layer are exposed for selective etching.

3. A method according to claim 1, which comprises providing a mask on the conductive layer to define the window in the conductive layer and leaving the mask in place during the isotropic etching of the insulating layer and subsequent selective etching of the conductive layer so that all of the upper surface of the conductive layer is masked from the selective etching of the conductive layer.

4. A method according to claim 1, 2 or 3, which comprises, prior to etching the insulating layer, introducing impurities into the semiconductor body to form a second region of the opposite conductivity type having a first subsidiary region underlaying part of the insulated gate so that the source region is formed within the first subsidiary region and defines therewith a conduction channel area beneath the insulated gate.

5. A method according to claim 4, which comprises introducing impurities of the opposite conductivity type into the semiconductor body prior to defining the insulated gate structure to provide a second subsidiary region of the second region to adjoin the first subsidiary region and surround the drain region.

6. A method according to claims 1, 2 or 3, which comprises introducing impurities of the one conductivity type into the semiconductor body prior to defining the insulated gate structure to provide a drain extension region adjacent the given surface extending towards the source region.

7. A method according to claims 1, 2 or 3, which comprises wet etching the relatively thick insulating region to define the window in the relatively thick insulating region and then plasma etching the conductive material to remove the conductive material overhanging the edge of the window in the relatively thick insulating material region.

8. A method according to claims 1, 2 or 3 which comprises providing the conductive layer as a layer of doped polycrystalline silicon.

* * * * *